United States Patent

Matsuyama et al.

(10) Patent No.: US 8,426,503 B2
(45) Date of Patent: Apr. 23, 2013

(54) COMPOSITION FOR POLYIMIDE RESIN, AND POLYIMIDE RESIN MADE OF THE COMPOSITION FOR POLYIMIDE RESIN

(75) Inventors: Hiroyuki Matsuyama, Joetsu (JP); Makoto Tai, Joetsu (JP); Nobuyuki Iwano, Joetsu (JP)

(73) Assignee: Arisawa Mfg. Co., Ltd., Niigata (JP)

( * ) Notice: Subject to any disclaimer, the term of this patent is extended or adjusted under 35 U.S.C. 154(b) by 0 days.

(21) Appl. No.: 13/124,633

(22) PCT Filed: May 31, 2010

(86) PCT No.: PCT/JP2010/059224
§ 371 (c)(1),
(2), (4) Date: Apr. 27, 2011

(87) PCT Pub. No.: WO2011/151886
PCT Pub. Date: Dec. 8, 2011

(65) Prior Publication Data
US 2011/0303438 A1 Dec. 15, 2011

(51) Int. Cl.
*C08K 5/34* (2006.01)
*C08K 5/3447* (2006.01)
*B32B 15/08* (2006.01)
*B32B 27/06* (2006.01)

(52) U.S. Cl.
USPC ......... 524/93; 524/90; 428/343; 428/355 CN; 428/458; 428/473.5; 428/626; 174/254

(58) Field of Classification Search ............ 524/90, 524/93; 428/343, 355 N, 355 AC, 355 EP, 428/355 EN, 458, 626, 355 CN, 473.5; 174/254
See application file for complete search history.

(56) References Cited

U.S. PATENT DOCUMENTS

| | | | |
|---|---|---|---|
| 5,397,684 | A | 3/1995 | Hogan et al. |
| 5,880,202 | A | 3/1999 | Yamashita et al. |
| 7,361,709 | B2 | 4/2008 | Tanaka et al. |
| 7,416,601 | B2 | 8/2008 | Erk et al. |
| 2010/0190897 | A1 | 7/2010 | Maletzko et al. |
| 2010/0193967 | A1* | 8/2010 | Takamoto ............ 257/778 |

FOREIGN PATENT DOCUMENTS

| | | |
|---|---|---|
| CN | 1573370 A | 2/2005 |
| CN | 1918239 A | 2/2007 |
| JP | 06-350120 A | 12/1994 |
| JP | 07-014762 A | 1/1995 |
| JP | 09-135067 A | 5/1997 |
| JP | 10-001626 A | 1/1998 |
| JP | 2007-522297 A | 8/2007 |
| JP | 2008-106250 A | 5/2008 |
| JP | 2009-058946 A | 3/2009 |
| WO | 2009/000830 A1 | 12/2008 |

OTHER PUBLICATIONS

Mizuguchi, Jin, "Single-component Black Pigments", Nihon Gazo Gakkaishi, 2006, 45(4):321-327, in Japanese with English abstract and figures.

* cited by examiner

*Primary Examiner* — Kriellion Sanders
(74) *Attorney, Agent, or Firm* — Drinker Biddle & Reath LLP

(57) ABSTRACT

A composition for a polyimide resin, comprising a polyamic acid and a perylene black pigment having an isoindole skeleton, wherein
a content of the perylene black pigment is 1 to 10% by mass based on 100% by mass of a weight of a solid content of the polyamic acid.

10 Claims, No Drawings

COMPOSITION FOR POLYIMIDE RESIN, AND POLYIMIDE RESIN MADE OF THE COMPOSITION FOR POLYIMIDE RESIN

This application is the U.S. national phase of International Patent Application No. PCT/JP2010/059224 filed May 31, 2010, the entire content of which is incorporated herein by reference.

FIELD OF THE INVENTION

The present invention relates to a novel composition for a polyimide resin, a polyimide resin made of the composition for a polyimide resin, a metal clad laminate, a coverlay, and a flexible printed wiring board.

BACKGROUND

Flexible printed wiring boards (FPCs) such as coverlays and metal clad laminates have conventionally been used, the flexible printed wiring board being formed by properly combining a resin layer having insulation such as a polyimide film and a polyamide film, an adhesive layer including an epoxy resin or a polyimide resin as a principal component, and a metallic foil layer having conductivity such as a copper foil, a silver foil, and an aluminum foil.

As the metal clad laminate, a three-layer flexible metal laminate formed of a metal layer, a polyimide layer, and an adhesive layer such as an epoxy resin, and a two-layer flexible metal laminate formed of a metal layer including a metallic foil and a polyimide layer are known.

Recently, the flexible metal clad laminate has often been used for electronic and optical apparatuses. Following this, light blocking properties of the flexible metal laminate are increasingly demanded. For example, in a method for brightening a mobile display, there are into two types: a planar light source type, and a type in which a light source is provided in an edge of a display and the whole display surface is brightened by a light guide plate and the like. Elaborate calculation is performed and both types are designed in order to brighten the display efficiently. However, there is a problem of both types of the planar light source and the edge light source that the light leaks from a flexible printed wiring board incorporated around the display, resulting in leak of the light to the outside from a junction of a casing. As a technique for solving this problem, a technique for giving a black color to a polyimide layer by blending of a pigment that absorbs light of all wavelengths is known.

For example, JP 9-135067 discloses a light-blocking coverlay film containing a black pigment having a specific average particle size in one or both of an insulation film and a thermosetting adhesive.

JP 6-350120 discloses a flexible printed wiring board in which one or both of an insulating substrate and a coverlay are a para-oriented aromatic polyamide film containing not less than 1% by weight of a dye or a pigment.

SUMMARY

However, the case where carbon black having conductivity is used as a black pigment as described in JP 9-135067 has a drawback that insulation is reduced and electrical properties are inferior.

Moreover, in a case where an organic dye or an organic pigment as described in JP 6-350120 is used, there is a problem that the dye or the pigment decomposes or sublimates at a step of processing a material under high temperature and high pressure conditions in the electronic industry material field or a step of processing at a high temperature at the time of production of a polyimide film, and thus stable color of black cannot be obtained.

In consideration of the circumstances above, in order to solve the problem, an object of the present invention is to provide a composition for a polyimide resin that can provide a polyimide resin having high light blocking properties and electrical properties.

DETAILED DESCRIPTION

As a result of extensive examination in order to solve the above problem, the present inventors found out that a composition for a polyimide resin, containing a polyamic acid and a perylene black pigment having an isoindole skeleton at a specific proportion can solve the problem, and have completed the present invention.

Namely, the present invention is as follows.

A composition for a polyimide resin, comprising a polyamic acid and a perylene black pigment having an isoindole skeleton, wherein a content of the perylene black pigment is 1 to 10% by mass based on 100% by mass of a weight of a solid content of the polyamic acid.

The composition for the polyimide resin described herein, wherein the perylene black pigment has a structure represented by the following general formula:

Formula 1

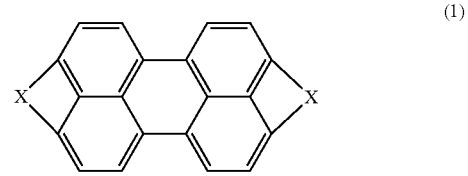

wherein X represents a divalent organic residue having an isoindole skeleton represented by the following general formula:

Formula 2

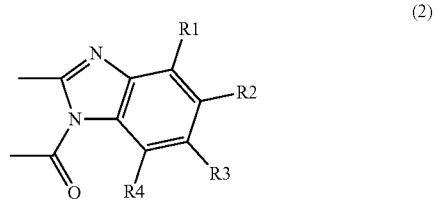

wherein R1, R2, R3, and R4 may be the same or different and each represent a hydrogen atom or a hydrocarbon group having 1 to 6 carbon atoms.

The polyimide resin obtained by curing the composition for a polyimide resin according to the formulas above.

A metal clad laminate in which the polyimide resin described herein is laminated on a metallic foil.

The metal clad laminate described herein, wherein the metal clad laminate is a two-layer flexible metal laminate.

A coverlay comprising a polyimide film formed from the polyimide resin described herein.

The coverlay described herein, further comprising an adhesive layer.

The coverlay described herein, wherein the adhesive layer comprises one or more resins selected from the group consisting of an epoxy resin, a phenoxy resin, an acrylic resin, and an urethane resin.

A flexible printed wiring board, in which the coverlay described herein is provided on a metallic foil having a circuit formed.

According to the present invention, a polyimide resin having high light blocking properties and electrical properties can be provided.

Hereinafter, an embodiment of the present invention (hereinafter, referred to as the "present embodiment") will be described in detail. Here, the present invention is not limited to the following embodiment, and can be practiced within the gist thereof by making various changes and modifications.

A composition for a polyimide resin according to the present embodiment contains a polyamic acid and a perylene black pigment having an isoindole skeleton. The content of the perylene black pigment is adjusted to 1 to 10% by mass based on 100% by mass of the weight of the solid content of the polyamic acid.

The polyamic acid in the present embodiment is not particularly limited, and can be obtained by condensation polymerization of tetracarboxylic acid dianhydride and a diamine compound by a known (solution polymerization) method.

Both aliphatic compounds and aromatic compounds can be used as the tetracarboxylic acid dianhydride and the diamine compound. The aromatic compounds are preferably used from the viewpoint of heat resistance.

Examples of the aromatic tetracarboxylic acid dianhydride include, but not particularly limited to, pyromellitic acid dianhydride, 3,3',4,4'-biphenyltetracarboxylic acid dianhydride, 3,3',4,4'-benzophenonetetracarboxylic acid dianhydride, 4,4'-oxydiphthalic anhydride, and 3,3',4,4'-diphenylsulfonetetracarboxylic acid dianhydride. Among them, 3,3',4,4'-biphenyltetracarboxylic acid dianhydride and pyromellitic acid dianhydride are preferable from the viewpoint of price or availability.

Examples of the aromatic diamine compound include, but not particularly limited to, p-phenylenediamine, m-phenylenediamine, 2,4-diaminotoluene, 4,4'-diaminobiphenyl, 4,4'-diamino-2,2'-bis(trifluoromethyl)biphenyl, 3,3'-diaminodiphenylsulfone, 4,4'-diaminodiphenylsulfone, 4,4'-diaminodiphenylsulfide, 4,4'-diaminodiphenylmethane, 4,4'-diaminodiphenylether, 3,4'-diaminodiphenylether, 3,3'-diaminodiphenylether, 1,4-bis(4-aminophenoxy)benzene, 1,3-bis(4-aminophenoxy)benzene, 1,3-bis(3-aminophenoxy)benzene, 4,4'-bis(4-aminophenoxy)biphenyl, bis[4-(4-aminophenoxy)phenyl]sulfone, bis[4-(3-aminophenoxy)phenyl]sulfone, 2,2-bis[4-(4-aminophenoxy)phenyl]propane, and 2,2-bis[4-(4-aminophenoxy)phenyl]hexafluoropropane. Among them, p-phenylenediamine, 4,4'-diaminodiphenylether, and 1,3-bis(4-aminophenoxy)benzene are preferable from the viewpoint of price and availability.

The tetracarboxylic acid dianhydride may be used alone or in combination, and the diamine compound may be used alone or in combination.

In the present embodiment, for example, the tetracarboxylic acid dianhydride is gradually added to a solution prepared by adding the diamine compound to the solvent and dissolving the diamine compound at room temperature to 30° C., and the solution is stirred under room temperature for not less than 0.5 hours. Thereby, the polyamic acid can be obtained as a precursor resin of the polyimide resin. At this time, the tetracarboxylic acid dianhydride may be added in the state where the diamine compound is dispersed without dissolving the diamine compound; or the tetracarboxylic acid dianhydride may be added to the solvent, and subsequently the diamine compound may be added in the state where the tetracarboxylic acid dianhydride is dissolved or dispersed. Subsequently, the solution is stirred under room temperature for not less than 0.5 hours. Thereby, the polyamic acid can be obtained. The polyamic acid according to the present embodiment can also be obtained in the case where the range of the stirring temperature is in the range of −10° C. to the boiling point of the solvent and the stirring time is not less than 0.5 hours.

The perylene black pigment having an isoindole skeleton according to the present embodiment (hereinafter, simply referred to as a "perylene black pigment.") is not particularly limited. Preferably, the perylene black pigment has a structure represented by the following general formula from the viewpoint of a balance between transparency and electrical properties:

Formula 3

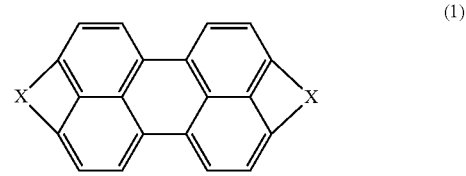

(1)

wherein X represents a divalent organic residue having an isoindole skeleton represented by the following general formula:

Formula 4

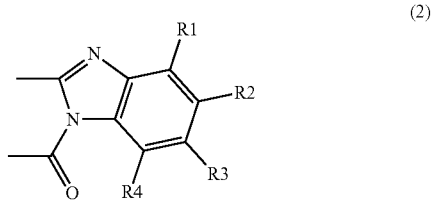

(2)

wherein R1, R2, R3, and R4 may be the same or different and each represent a hydrogen atom or a hydrocarbon group having 1 to 6 carbon atoms.

Here, examples of the hydrocarbon group having 1 to 6 carbon atoms include an alkyl group that may be replaced, a cycloalkyl group that may be replaced, and a phenyl group that may be replaced.

The "alkyl group" of the alkyl group that may be replaced represents a linear or branched alkyl group having 1 to 6 carbon atoms and preferably 1 to 3 carbon atoms. Examples thereof include a methyl group, an ethyl group, a propyl group, an isopropyl group, a butyl group, an isobutyl group, a sec-butyl group, a tert-butyl group, a pentyl group, and a hexyl group. The methyl group and the ethyl group are preferable, and the methyl group is more preferable.

The "cycloalkyl group" of the cycloalkyl group that may be replaced represents a cycloalkyl group having 3 to 6 carbon atoms. Examples thereof include a cyclopropyl group, a cyclobutyl group, a cyclopentyl group, and a cyclohexyl group. The cyclopentyl group and the cyclohexyl group are preferable.

The alkyl group, the cycloalkyl group, and the phenyl group may be replaced at a replaceable position by one or two or more substituents. Examples of the substituent include halogen atoms (for example, a fluorine atom, a chlorine atom, and a bromine atom), an alkyl group having 1 to 6 carbon atoms (for example, a methyl group, an ethyl group, a propyl group, an isopropyl group, a butyl group, an isobutyl group, a sec-butyl group, a tert-butyl group, a pentyl group, and a hexyl group), an aryl group (for example, a phenyl group and a naphthyl group), an aralkyl group (for example, a benzyl group and a phenethyl group), and an alkoxy group (for example, a methoxy group and an ethoxy group).

In the composition for a polyimide resin according to the present embodiment, the content of the perylene black pigment having an isoindole skeleton is 1 to 10% by mass, preferably 2 to 8% by mass, and more preferably 3 to 6% by mass based on 100% by mass of the weight of the solid content of the polyamic acid. When a content of the perylene black pigment is less than 1% by mass, it is difficult to give sufficient light blocking properties to the polyimide resin because light transmittance is increased. When a content of the perylene black pigment exceeds 10% by mass, the electrical properties of the polyimide resin are reduced.

The composition for a polyimide resin according to the present embodiment may include a solvent in addition to the polyamic acid and the perylene black pigment. Examples of the solvent include aprotic polar solvents such as N,N-dimethylacetamide, N-methyl-2-pyrrolidone, and γ-butyrolactone. Preferably, the solvent is a solvent selected from the group consisting of N,N-dimethylacetamide and N-methyl-2-pyrrolidone.

The content of the solvent is preferably 80 to 90% by mass based on the whole amount of the composition for a polyimide resin. A content of the solvent of 80 to 90% by mass can provide varnish viscosity at which application properties are good. In the present embodiment, the "whole amount" refers to a mass of a dissolving content in the composition for a polyimide resin. The "solid content" refers to a solid itself, and the "dissolving content" refers to what the solid content dissolves in the solvent. The content of the solvent can be determined as ((mass of the solvent)/(mass of the whole amount of the composition for a polyimide resin))×100.

The composition for a polyimide resin according to the present embodiment can be obtained by mixing the polyamic acid and the perylene black pigment at a specific proportion in the solvent, for example. An imidization accelerator represented by tertiary amines such as pyridine and acid anhydrides such as acetic anhydride, a leveling agent such as a surface active agent, and a filler may further be added to the composition for a polyimide resin according to the present embodiment. Further, a flame retardant may be blended with the composition for a polyimide resin according to the present embodiment in order to obtain more favorable flame resistance. Examples of the flame retardant include inorganic fillers such as aluminum hydroxide, silica, and barium sulfate, or organic phosphorous compounds such as phosphoric ester. These may be used alone, or may be used in combination.

A metal clad laminate according to the present embodiment is formed by laminating a polyimide resin obtained by curing the above composition for a polyimide resin on a metallic foil.

The metal clad laminate may be either a three-layer flexible metal laminate formed of a metallic foil, a polyimide resin layer, and an adhesive layer, or a two-layer flexible metal laminate formed of a metallic foil and a polyimide resin layer.

From the viewpoint of heat resistance, dimensional stability, and weight reduction, the metal clad laminate is preferably the two-layer flexible metal laminate.

Examples of the metallic foil include a copper foil, an SUS foil, and an aluminum foil. From the viewpoint of conductivity and circuit workability, the copper foil is preferable. In the case where the metallic foil is used, an inorganic surface process by zinc plating, chrome plating, and the like or an organic surface process by a silane coupling agent or the like may be performed.

The two-layer flexible metal laminate according to the present embodiment is produced, for example, by a method comprising a step of applying the composition for a polyimide resin to the metallic foil, a step of drying the composition for a polyimide resin applied to the metallic foil, and a step of raising a temperature to 330 to 400° C. to obtain a polyimide resin layer.

At the application step, although the thickness of the coated layer formed on the metallic foil changes according to applications, the thickness thereof is properly set between 2 to 150 μm. As a coating method, a comma coater, a die coater, a gravure coater, or the like can be properly used according to the thickness of the coated layer.

The step of drying the composition for a polyimide resin applied to the metallic foil is preferably performed by drying at 80 to 150° C. for 1 to 30 minutes. The amount of the remaining solvent after the application and drying steps is preferably not more than 50% by mass based on 100% by mass of the polyamic acid.

The metal clad laminate can also be produced by the following separate formation method.

First, the composition for a polyimide resin is applied onto a release film such as PET (polyethylene terephthalate) films, PP (polypropylene) films, and PE (polyethylene) films to form a coated layer. Subsequently, the coated layer is cured and dried on fixed curing and drying conditions (the temperature is 80 to 160° C., and the time is 1 to 30 minutes) until the coated layer becomes half cured (hereinafter, referred to as a B stage), to obtain a polyimide resin layer. Peelability from the polyimide resin layer can be improved by performing a releasing process on the surface of the release film.

Next, the resin surface of the polyimide resin layer and a rough surface of the metallic foil are bonded to each other to produce a metal clad laminate. As a bonding method, a method by a press, a laminating method using a hot calender roll, and the like can be used. As bonding conditions, preferably, the temperature is within the range of 200 to 350° C. and the pressure is within the range of 0.5 to 5 MPa.

While the single-sided metal clad laminate has been described in the above description, the metal clad laminate according to the present embodiment can also be applied as a double-sided metal clad laminate in which the metallic foil is provided on both sides of the polyimide resin layer. The double-sided metal clad laminate can be produced as follows: the metallic foil is provided on both sides of a resin sheet produced by the above separate formation method, and subsequently, the metallic foils and the resin sheet are thermocompression bonded by the above bonding method.

The metal clad laminate according to the present embodiment contains a specific amount of the perylene black pigment in the polyimide resin layer. Accordingly, the metal clad laminate has characteristics of high light blocking properties and high electrical properties such as dielectric constant and dielectric dissipation factor.

Moreover, the metal clad laminate according to the present embodiment contains a polyimide resin in which a polyamic acid is condensed and thus dimensional stability is favorable and peel-off of a metal wiring or the like is reduced during processing and in the final product state. For this reason, life span of the product is improved.

In addition, the polyimide resin layer has heat resistance. For this reason, the polyimide resin layer can be ready for processing even if the processing temperature is high, and can be processed without reducing the temperature. Thereby, the processing time can be reduced. Further, a metal clad laminate having improved workability and yield in wiring formation and semiconductor element packaging can be provided.

The etching surface obtained by etching the metal layer of the metal clad laminate according to the present embodiment into a predetermined form is coated with a coverlay for covering a metallic foil circuit, and thereby a circuit coated with the coverlay can be obtained. The coverlay is not limited as long as the coverlay covers the metallic foil circuit, and examples thereof include a coverlay having an adhesive applied to a film of polyimide or the like, a liquid resist, and a dry film resist.

From the viewpoint of dimensional stability, the coefficient of thermal linear expansion CTE ($10^{-6}$/K) of the polyimide resin layer included in the metal clad laminate is preferably not more than $25 \times 10^{-6}$/K, and more preferably not more than $23 \times 10^{-6}$/K.

The light transmittance (%) of the polyimide resin layer included in the metal clad laminate is preferably not more than 1%. When a light transmittance of the polyimide resin layer is not more than 1%, the light blocking properties of the metal clad laminate and flexible printed wiring board including the polyimide resin layer are improved. For this reason, leakage of the light from a light source is reduced, and thus visibility of a display portion such as a button is improved in the final product state.

As hue of the polyimide resin layer included in the metal clad laminate, an a* value of −5 to 5, a b* value of −10 to 10, and an L* value of not more than 5 are preferable, and −4 to 4 is more preferable. When a hue of the polyimide resin layer is within the above-mentioned range, the light blocking properties of the metal clad laminate and flexible printed wiring board including the polyimide resin layer are improved. For this reason, leakage of the light from a light source is reduced, and thus visibility of a display portion such as a button is improved in the final product state.

Here, the a* value and the b* value are "chroma coordinates" indicating hue and saturation, and the L* value is a "lightness index."

From the viewpoint of heat resistance, the glass transition temperature Tg (° C.) of the polyimide resin layer included in the metal clad laminate is preferably 300 to 400° C., and more preferably not less than 310° C.

The breakdown withstand voltage (kV/mm) of the polyimide resin layer included in the metal clad laminate is preferably not less than 150 kV/mm, and more preferably not less than 175 kV/mm. When a breakdown withstand voltage of the polyimide resin layer is within the above-mentioned range, the electrical properties of the metal clad laminate and flexible printed wiring board including the polyimide resin layer are improved.

The dielectric constant of the polyimide resin layer included in the metal clad laminate is preferably not more than 4.0, and more preferably not more than 3.5. The dielectric dissipation factor thereof is preferably not more than 0.02, and more preferably not more than 0.01. If the dielectric constant and dielectric dissipation factor of the polyimide resin layer are within the above-mentioned ranges, the electrical properties of the metal clad laminate and flexible printed wiring board including the polyimide resin layer are improved.

Here, the CTE, the light transmittance, the hue, the Tg, the breakdown withstand voltage, the dielectric constant, and the dielectric dissipation factor can be measured by a method described in the following Examples.

A coverlay according to the present embodiment includes a polyimide film formed from the above polyimide resin.

The configuration of the coverlay is not particularly limited. Usually, the coverlay further including an adhesive layer in addition to a resin layer composed of a polyimide film has characteristics of a high light blocking effect and electrical properties because the coverlay includes the resin layer composed of the above polyimide film. Further, the coverlay has high flame resistance, solder heat resistance, and circuit filling properties unique to the coverlay, and can maintain high adhesiveness. Moreover, a coverlay formed of a polyimide film and a release film can have a reduced weight in addition to the above characteristics. The coverlay according to the present embodiment can also be used without improving an existing step of producing a flexible printed wiring board, and thus manufacturing cost can be reduced also with respect to facilities.

The adhesive layer included in the coverlay is not particularly limited, and can include one or more resins selected from an epoxy resin, a phenoxy resin, an acrylic resin, and a urethane resin, for example. In accordance with the kind of the resin, an additive such as a curing agent can also be added to the adhesive layer.

As a method for producing a coverlay, in the case of the coverlay formed of a polyimide film and a release film, the coverlay can be produced by forming the polyimide resin layer on the release film by the separate formation method mentioned above, for example. In the separate formation method, the polyimide resin layer does not need to be cured completely. The polyimide resin layer is cured and dried on fixed curing and drying conditions (the temperature is 80 to 160° C., and the time is 1 to 30 minutes) until the coated layer becomes half cured (the B stage), to obtain the polyimide resin layer. The release film may be provided on both sides of the polyimide resin layer, and is removed properly to be used when the coverlay is used.

In the case where the coverlay further includes the adhesive layer, the polyimide resin layer produced by the above separate formation method is cured nearly completely on fixed curing and drying conditions (the temperature is 300 to 400° C., and the time is 1 to 30 minutes). Next, in order to form the adhesive layer, on the polyimide resin layer, the adhesive layer is cured and dried until the adhesive layer becomes half cured (the B stage) on fixed curing and drying conditions (the temperature is 80 to 160° C., and the time is 1 to 30 minutes), to obtain the adhesive layer. The curing conditions can be properly adjusted according to the resin of the base resin, the amount of the curing agent, and the like. The release film may be provided on both sides of the coverlay, and is removed properly to be used when the coverlay is used.

A flexible printed wiring board according to the present embodiment is formed by providing the above coverlay on the metallic foil having a circuit formed. The thickness of the flexible printed wiring board according to the present embodiment can be arbitrarily set according to application.

In the flexible printed wiring board, in the case of the coverlay formed of the polyimide film and the release film, the coverlay also acts as an inter-layer adhesive (bonding sheet) used for a multilayer printed wiring board. Specifically, in the flexible printed wiring board, the coverlay is laminated on the exposed circuit formation surface on the metallic foil, other flexible printed wiring board is laminated on the coverlay, and the laminated body is heated and pressurized on a predetermined condition. Thus, a multilayer printed wiring board can be produced. For this reason, the bonding sheet for joining the flexible printed wiring boards having the coverlay provided on the circuit formation surface becomes unnecessary, leading to reduction in the weight of the multilayer printed wiring board. Moreover, a multilayer printed wiring board with a higher density can be obtained. In the case where the circuit formation surfaces of the flexible printed wiring boards are laminated facing each other, the thickness of the coverlay needs to be sufficiently thick so as not to contact the circuit formation surfaces with each other.

The flexible printed wiring board according to the present embodiment is suitably used as the so-called chip-on flexible printed wiring board for IC chip packaging, for example.

EXAMPLES

Hereinafter, the present invention will be more specifically described according to Examples and Comparative Examples, but the present invention will not be limited only to these Examples.

An acid anhydride component, a diamine component, a solvent, and a perylene black pigment used in Examples and Comparative Examples are as follows.
Acid Anhydride Component
BPDA: 3,4,3',4'-biphenyltetracarboxylic acid dianhydride (made by Ube Industries, Ltd.)
PMDA: pyromellitic anhydride dianhydride (made by Daicel Chemical Industries, Ltd.)
Diamine Component
p-PDA: p-phenylenediamine (made by Kanto Chemical Co., Inc.)
4,4'-DAPE: 4,4'-diaminodiphenyl ether (made by Wakayama Seika Kogyo Co., Ltd.)
Solvent
NMP: N-methyl-2-pyrrolidone (made by Kanto Chemical Co., Inc.)
Perylene black pigment having an isoindole skeleton
FK4280: LUMOGEN Black FK4280 (made by BASF)
The FK4280 is a mixture of isomers represented by the following general formulas:

Formula 5

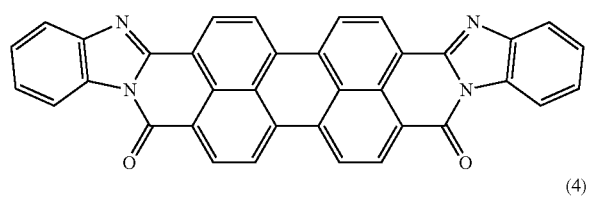

(3)

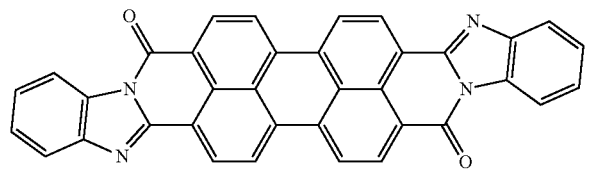

(4)

Other Perylene Black Pigments
L-0086: Paliogen Black L-0086 (made by BASF)
S-0084: Paliogen Black S-0084 (made by BASF)
Here, the L-0086 is a perylene black pigment having a methoxybenzyl group in the molecular terminal Y in the following general formula (5), and the S-0084 is a perylene black pigment having a phenylethyl group in the molecular terminal Y in the following general formula:

Formula 6

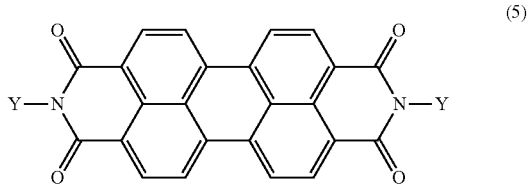

(5)

An evaluation method and a measuring method in Examples and Comparative Examples are as follows. In each measurement, a polyimide film obtained by removing a copper foil of a two-layer flexible copper clad laminate obtained in each of Examples and Comparative Examples was used.
(1) CTE Measurement
Using a thermomechanical analyzer TMA-60 made by Shimadzu Corporation, the CTE was determined from dimensional change of a sample from 100° C. to 200° C. when the sample had a width of 5 mm and a length of 15 mm and was heated at a load of 5 g and a temperature raising rate of 10° C./min.
(2) Light Transmittance, a* Value, b* Value, and L* Value
The transmittance at a wavelength of 500 nm was determined using a spectrophotometer U-4100 made by Hitachi, Ltd.
The transmittance at a wavelength of 380 to 780 nm was measured using the spectrophotometer U-4100 made by Hitachi, Ltd, to determine the a* value, the b* value, and the L* value.
(3) Measurement of Tg
With respect to the Tg, dynamic viscoelasticity when the temperature was raised at 10° C./min was measured using a dynamic viscoelasticity measuring apparatus RSAII made by Rheometric Scientific, Inc. The Tg was determined from the local maximum of tanδ.
(4) Breakdown Withstand Voltage
A breakdown voltage was defined as a voltage until a voltage withstand tester HVT-200-5 made by Yamabishi Corporation was used to increase a voltage at 0.5 kV/sec in the film thickness direction and conduct a current.
(5) Dielectric Constant, Dielectric Dissipation Factor
Using a PNA-L Network Analyzer N-5230A made by Agilent Technologies, Inc., the dielectric constant and dielectric dissipation factor at a frequency of 5 GHz were determined by a split post dielectric resonator method (the SPDR method).

Example 1

255 g of NMP was added to a 500-L flask as a polymerization solvent. Next, 9.4 g (0.087 mol) of p-PDA and 4.3 g (0.022 mol) of 4,4'-DAPE were added as a diamine component. Subsequently, the diamine components p-PDA and 4,4'-DAPE were dissolved in NMP by stirring at 30° C.
To the obtained solution, 25.6 g (0.087 mol) of BPDA and 4.8 g (0.022 mol) of PMDA were gradually added together as an acid anhydride component.

Then, the solution was stirred under room temperature for 10 hours to obtain a polyamic acid resin solution. The weight of the solid content of the polyamic acid in 100 g of the obtained polyamic acid resin solution was 15 g. Here, the weight of the solid content of the polyamic acid was calculated from the masses of the acid anhydride compound, the diamine compound, and the solvent prepared.

0.45 g of a perylene black pigment FK4280 having an isoindole skeleton was added to 100 g of the obtained polyamic acid resin solution (the weight of the solid content of 15 g), and the solution was stirred for 3 hours to obtain a black composition for a polyimide resin.

The above composition for a polyimide resin was applied to a glossy surface of a copper foil using a bar coater such that a thickness of the resin layer after imidization might be 25 μm, and dried at 130° C. for 10 minutes. The copper foil having a polyamic acid resin solution applied thereto and dried was cooled to room temperature, raised to 350° C. in 5 hours, and kept at 350° C. for 30 minutes. Subsequently, the copper foil was cooled naturally to room temperature to obtain a two-layer flexible copper clad laminate. The copper foil in the obtained two-layer flexible copper clad laminate was removed to obtain a black polyimide film having a thickness of 25 μm.

Examples 2 and 3

A two-layer flexible copper clad laminate and a black polyimide film were obtained by the same method as that in Example 1 except that the amount of the perylene black pigment having an isoindole skeleton to be added was replaced by the amount shown in Table 1.

Comparative Example 1

The polyamic acid resin solution obtained in Example 1 was applied to a glossy surface of a copper foil using a bar coater such that a thickness of the resin layer after imidization might be 25 μm, and dried at 130° C. for 10 minutes. The copper foil having a polyamic acid resin solution applied thereto and dried was cooled to room temperature, raised to 350° C. in 5 hours, and kept at 350° C. for 30 minutes. Subsequently, the copper foil was cooled naturally to room temperature to obtain a two-layer flexible copper clad laminate. The copper foil in the obtained two-layer flexible copper clad laminate was removed to obtain a yellow transparent polyimide film having a thickness of 25 μm.

Comparative Examples 2 and 3

A two-layer flexible copper clad laminate and a polyimide film were obtained by the same method as that in Example 1 except that the amount of the perylene black pigment having an isoindole skeleton to be added was replaced by the amount shown in Table 2.

Comparative Examples 4 to 6

A two-layer flexible copper clad laminate and a polyimide film were obtained by the same method as that in Example 1 except that the kind and amount of the perylene black pigment to be added were replaced by the kind and amount thereof shown in Table 2.

Table 1 shows the above Examples 1 to 3, and Table 2 shows evaluation results of Comparative Examples 1 to 6.

TABLE 1

|  | Example 1 | Example 2 | Example 3 |
|---|---|---|---|
| Polyamic acid resin solution (solid content of 15 g) | 100 | 100 | 100 |
| Kind of perylene black pigment | FK4280 | FK4280 | FK4280 |
| Amount of perylene black pigment to be added | 0.45 (3 wt %) | 0.6 (4 wt %) | 1.2 (8 wt %) |
| CTE ($10^{-6}$/K) | 19 | 18 | 18 |
| Light transmittance (%) | 3.0 | 0.2 | 0.1 |
| a* value | −3.5 | −0.6 | −0.1 |
| b* value | 6.0 | 3.2 | 1.2 |
| L* value | 3.7 | 2.1 | 1.1 |
| Tg (° C.) | 338 | 338 | 338 |
| Breakdown withstand voltage (kV/mm) | 230 | 190 | 170 |
| Dielectric constant | 3.49 | 3.55 | 3.68 |
| Dielectric dissipation factor | 0.003 | 0.003 | 0.005 |

TABLE 2

|  | Comparative Example 1 | Comparative Example 2 | Comparative Example 3 | Comparative Example 4 | Comparative Example 5 | Comparative Example 6 |
|---|---|---|---|---|---|---|
| Polyamic acid resin solution (solid content of 15 g) | 100 | 100 | 100 | 100 | 100 | 100 |
| Kind of perylene black pigment | — | FK4280 | FK4280 | L-0086 | S-0084 | S-0084 |
| Amount of perylene black pigment to be added | 0 | 0.05 (0.3 wt %) | 4.5 (30 wt %) | 0.45 (3 wt %) | 0.45 (3 wt %) | 0.6 (4 wt %) |
| CTE ($10^{-6}$/K) | 18 | 19 | 18 | 19 | 18 | 19 |
| Light transmittance (%) | 60.0 | 42.0 | 0.0 | 11.0 | 25.9 | 12.8 |
| a* value | −8.8 | −7.9 | 0.05 | 8.6 | 1.1 | 10.1 |
| b* value | 40.0 | 24.8 | 0.8 | 53.0 | 58.4 | 57.8 |
| L* value | 83.9 | 60.4 | 0.2 | 54.7 | 70.0 | 57.3 |
| Tg (° C.) | 338 | 338 | 338 | 338 | 338 | 338 |

TABLE 2-continued

| | Comparative Example 1 | Comparative Example 2 | Comparative Example 3 | Comparative Example 4 | Comparative Example 5 | Comparative Example 6 |
|---|---|---|---|---|---|---|
| Breakdown withstand voltage (kV/mm) | 240 | 240 | 100 | 220 | 210 | 200 |
| Dielectric constant | 3.42 | 3.47 | 3.89 | 3.48 | 3.43 | 3.50 |
| Dielectric dissipation factor | 0.004 | 0.004 | 0.010 | 0.003 | 0.003 | 0.004 |

The results of Table 1 show that the polyimide films obtained using the composition for a polyimide resin according to the present embodiment (Examples 1 to 3) have a good balance between the light blocking properties and electrical properties.

The composition for a polyimide resin according to the present embodiment has industrial applicability in application of metal clad laminates, coverlays, and flexible printed wiring boards.

The invention claimed is:

1. A composition for a polyimide resin, comprising a polyamic acid and a perylene black pigment having a benzimidazole skeleton, wherein:

a content of the perylene black pigment is 1 to 10 parts by mass based on 100 parts by mass of a weight of a solid content of the polyamic acid;

the perylene black pigment has a structure represented by the following general formula (1):

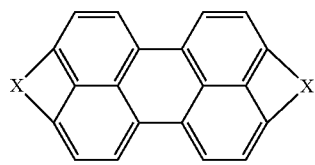

(1)

wherein X represents a divalent organic residue having a benzimidazole skeleton represented by the following general formula (2):

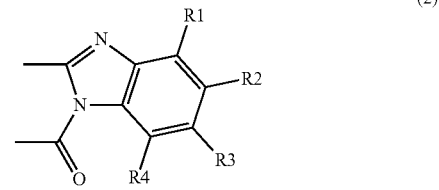

(2)

wherein R1, R2, R3, and R4 may be the same or different and each represent a hydrogen atom or a hydrocarbon group having 1 to 6 carbon atoms.

2. The polyimide resin obtained by curing the composition for a polyimide resin according to claim 1.

3. A metal clad laminate in which the polyimide resin according to claim 2 is laminated on a metallic foil.

4. The metal clad laminate according to claim 3, wherein the metal clad laminate is a two-layer flexible metal laminate.

5. A coverlay comprising a polyimide film formed from the polyimide resin according to claim 2.

6. The coverlay according to claim 5, further comprising an adhesive layer.

7. The coverlay according to claim 6, wherein the adhesive layer comprises one or more resins selected from the group consisting of an epoxy resin, a phenoxy resin, an acrylic resin, and an urethane resin.

8. A flexible printed wiring board, in which the coverlay according to claim 5 is provided on a metallic foil having a circuit formed.

9. A flexible printed wiring board, in which the coverlay according to claim 6 is provided on a metallic foil having a circuit formed.

10. A flexible printed wiring board, in which the coverlay according to claim 7 is provided on a metallic foil having a circuit formed.

* * * * *